United States Patent
Roberson

(10) Patent No.: US 9,664,710 B2
(45) Date of Patent: *May 30, 2017

(54) SENSORY ASSEMBLY SYSTEM AND METHOD

(71) Applicant: Hershel Roberson, Johnson City, TX (US)

(72) Inventor: Hershel Roberson, Johnson City, TX (US)

(73) Assignee: CLEAVELAND/PRICE INC., Trafford, PA (US)

( * ) Notice: Subject to any disclaimer, the term of this patent is extended or adjusted under 35 U.S.C. 154(b) by 551 days.

This patent is subject to a terminal disclaimer.

(21) Appl. No.: 13/748,609

(22) Filed: Jan. 24, 2013

(65) Prior Publication Data

US 2014/0203817 A1 Jul. 24, 2014

(51) Int. Cl.
*G01R 31/02* (2006.01)
*G01R 15/14* (2006.01)
*H02J 13/00* (2006.01)
*G01R 15/04* (2006.01)
*G01R 15/18* (2006.01)

(52) U.S. Cl.
CPC ........ *G01R 15/142* (2013.01); *H02J 13/0075* (2013.01); *G01R 15/04* (2013.01); *G01R 15/181* (2013.01); *Y02E 60/727* (2013.01); *Y02E 60/74* (2013.01); *Y02E 60/7853* (2013.01); *Y04S 10/26* (2013.01); *Y04S 10/30* (2013.01); *Y04S 40/126* (2013.01)

(58) Field of Classification Search
CPC ... G01R 19/2513; G01R 31/021; G08C 17/02
See application file for complete search history.

(56) References Cited

U.S. PATENT DOCUMENTS

| | | | |
|---|---|---|---|
| 7,295,133 B1* | 11/2007 | McCollough, Jr. | 340/870.07 |
| 2006/0084419 A1* | 4/2006 | Rocamora et al. | 455/419 |
| 2014/0207399 A1* | 7/2014 | Roberson | 702/62 |

OTHER PUBLICATIONS

Hall Effect Sensor, available at http://en.wikipedia.org/wiki/Hall_effect_sensor on Nov. 13, 2011.*

(Continued)

*Primary Examiner* — Daniel Miller
(74) *Attorney, Agent, or Firm* — Ronald S. Lombard

(57) ABSTRACT

A sensory assembly system and method for monitoring power lines. The system comprises a plurality of sensory assemblies each connected to a phase of a power line, each comprising a sensory transceiver that broadcasts a signal comprising a digital representation of a voltage wave and a current wave on a single phase of a power line, and a common assembly comprising a common transceiver for receiving said signal, and a microprocessor for analyzing said signal, and a precision timing device for directing said common transceiver to send signals to each of said sensory assemblies synchronizing sensory assembly readings on a phase of a power line. The microprocessor analyzing timed signals synchronized for a plurality of phases by determining the net real time sum of the current of the plurality of phases to determine ground or neutral current and for determining instantaneous current and voltage between the plurality of phases.

20 Claims, 9 Drawing Sheets

(56) References Cited

OTHER PUBLICATIONS

Spread Spectrum, available at http://en.wikipedia.org/wiki/Spread_spectrum on Jan. 11, 2012.*
Timing Synchronization Function, available at https://en.wikipedia.org/wiki/Timing_Synchronization_Function on Aug. 18, 2016.*

* cited by examiner

SENSORY ASSEMBLY SYSTEM AND METHOD

BACKGROUND

This disclosure relates to an improved sensory assembly system and method.

In earlier times the measurement of low level currents on ground conductors, signal cables, and other physical structures has been used as diagnostic tools for power quality analysis. Ground currents are measured in order to detect an unwanted connection between system conductors or with ground. Ground currents can be evidence of a damaged power system, such as when a tree falls on a power line. Undetected ground faults can cause problems with different production and/or industrial processes. Thus, unnoticed ground faults can damage or even shutdown equipment, affecting productivity. Additionally, ground faults can result in dangerous voltage that poses potential health and safety risks such as fire or electric shock.

Over time, monitoring systems for ground and phase currents have evolved. The most basic is a system directly connected to a power line by a cable wire. The cable wire attaches the power line to a monitoring system, which performs calculations regarding voltage, ground and phase currents. However, the problem with a directly wired system is the danger of damaging the monitoring equipment if the power lines short circuit or are ever struck by lightning. More recently, a wireless system has developed in which the monitoring system wirelessly measures phase shifts between voltage and current, for each line. However, the problem with present power line monitoring systems is that although they can currently calculate voltage and phase currents on each individual power line, they are unable to do any calculations that look at all the lines together, such as calculating ground current.

As such it would be useful to have an improved sensory assembly system and method.

SUMMARY

An improved sensory assembly system and method is disclosed herein. Specifically, the system for monitoring power lines comprises a sensory assembly, said sensory assembly connected to each phase of a power line, said sensory assembly comprising a sensory transceiver that broadcasts a signal, said signal comprising a digital representation of a voltage wave and a current wave on a single phase of a power line, and a common assembly comprising a common transceiver, said common transceiver receiving said signal, and a common microprocessor, said microprocessor analyzing said signal, and a precision timing device, said precision timing device directing said common transceiver to send signals to said sensory assembly, said signals synchronizing sensory assembly readings on a phase of a power line. The common microprocessor analyzing time signals synchronized for the plurality of phases by determining the net real time sum of the current of the plurality of phases to determine ground or neutral current and for determining instantaneous current and voltage between the plurality of phases.

DETAILED DESCRIPTION

Described herein is a system and method for measuring phase and ground currents on a powerline. The following description is presented to enable any person skilled in the art to make and use the invention as claimed and is provided in the context of the particular examples discussed below, variations of which will be readily apparent to those skilled in the art. In the interest of clarity, not all features of an actual implementation are described in this specification. It will be appreciated that in the development of any such actual implementation (as in any development project), design decisions must be made to achieve the designers' specific goals (e.g., compliance with system- and business-related constraints), and that these goals will vary from one implementation to another. It will also be appreciated that such development effort might be complex and time-consuming, but would nevertheless be a routine undertaking for those of ordinary skill in the field of the appropriate art having the benefit of this disclosure. Accordingly, the claims appended hereto are not intended to be limited by the disclosed embodiments, but are to be accorded their widest scope consistent with the principles and features disclosed herein.

Figure 1:
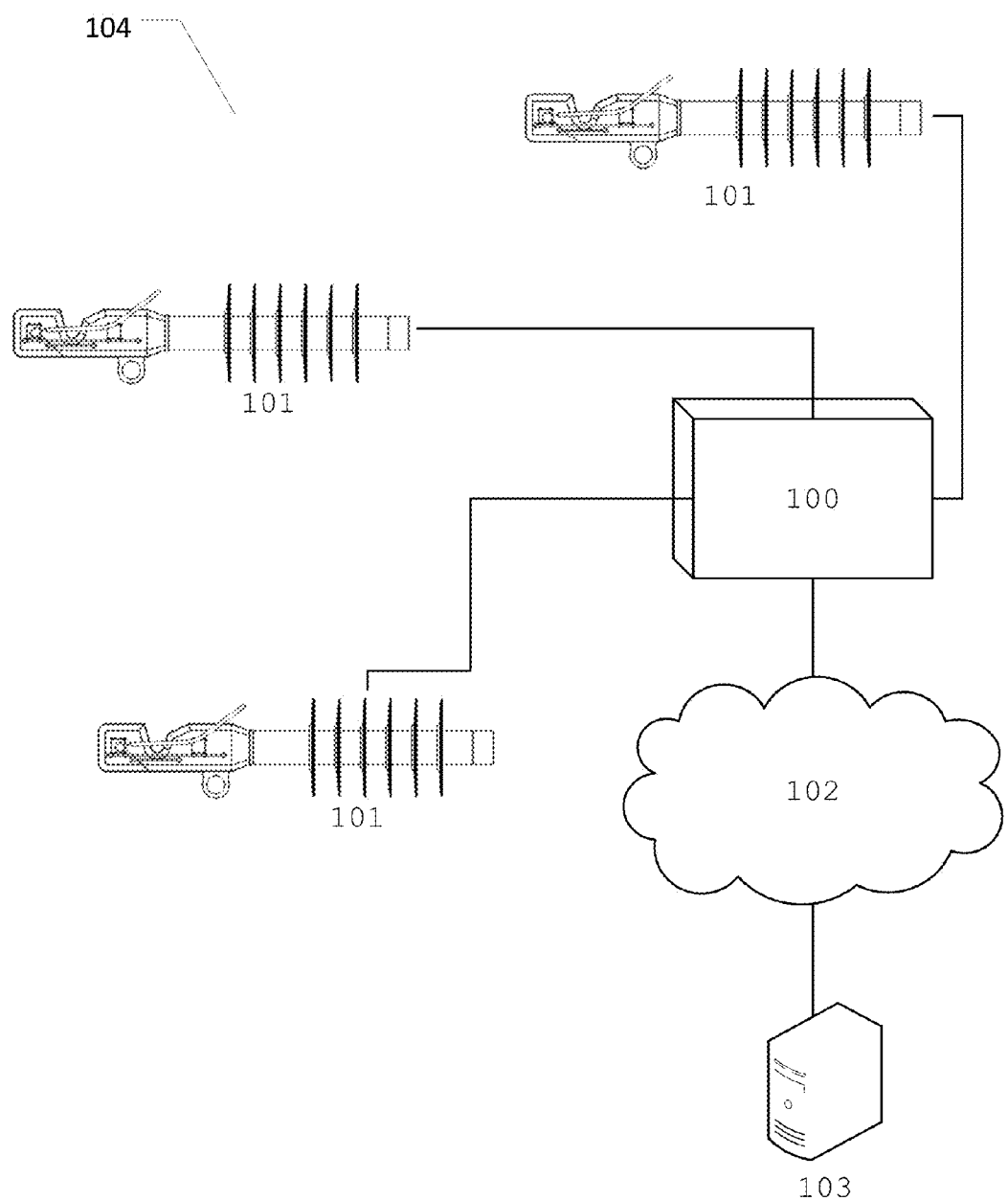
FIG. 1 illustrates a power line monitoring system in communication with a system monitoring server.

FIG. 1 illustrates a power line monitoring system 104. Power line monitoring system 104 can comprise a common assembly 100, a sensory assembly 101, a network 102, and a monitoring computer 103. Sensory assembly 101 can receive and send data. Data can, in one embodiment, comprise an electrical signal. Once received, sensory assembly 101 can send an electrical signal to common assembly 100. Common assembly 100 can process received data. Once processed, common assembly 100 can, in one embodiment, send data through network 102. Network 102 can be a local area network (LAN), a wide area network (WAN) or a combination of LANs, WANs. One illustrative LAN is a network within a single business. One illustrative WAN is the Internet. For the purposes of this disclosure, network 102 can comprise analog and digital cables.

Data in network 102 can be sent to and/or accessed by monitoring computer 103. Monitoring computer 103 can comprise any equipment capable of carrying out arithmetic and logic operations. Monitoring computer 103 can store and send out data information via network 102. Monitoring computer 103 can include, but is not limited to, a laptop and/or a mobile device. Once received, monitoring computer 103 can perform other operations on the data.

Figure 2:
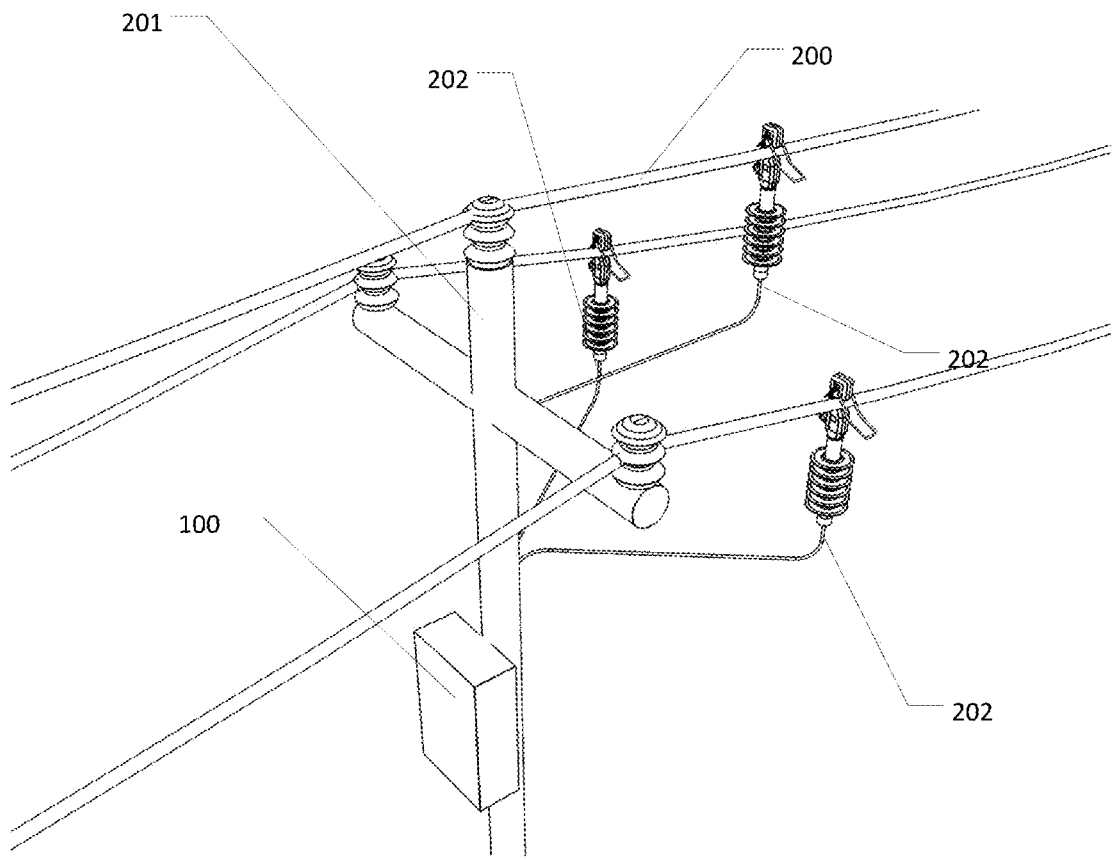
FIG. 2 illustrates a power line monitoring system mounted to a utility pole and power lines.

FIG. 2 illustrates a power line monitoring system 104 mounted to a utility pole 201 and power lines 200. Sensory assembly 101 can be attached directly to power lines 200, in one embodiment, or even the conductor of power lines 200, in another embodiment. After physical connection to power lines 200, sensory assembly 101 can monitor an electrical signal from power line 200, the electrical signal proportional to the electricity flowing through power line 200. In one embodiment, sensory assembly 101 can have a plurality of ground wires 202. Ground wires 202 can be flexible, insulated wires that can extend from the bottom of sensory assembly 101 and attach to utility pole 201. In one embodiment, ground wires 202 can converge at one point on utility pole 201. Ground wires 202 can attach to pole by a variety of methods known by a person having ordinary skill in the art, which can include, but is not limited to, wire clamps, and/or terminal blocks. In one embodiment, each sensory assembly 101 can be powered by power line 200.

Common assembly 100 can be attached to utility pole 201, in one embodiment. Location of common assembly 100 at utility pole 201 can allow common assembly 100 the proximity to facilitate reception of data from sensory assembly 101. Common assembly 100 can then send data regarding the electrical current, for example, of power lines 200 to network 102. Network 102 can then send and/or make data accessible to monitoring computer 103.

In one embodiment, network 102 and monitoring computer 103 can be located separately from on site power line 200 and/or utility pole 201. In one embodiment, communication between sensory assembly 101 and common assembly 100 can be wireless. In one embodiment, network 102, and monitoring computer 103 can be wireless.

Figure 3A:
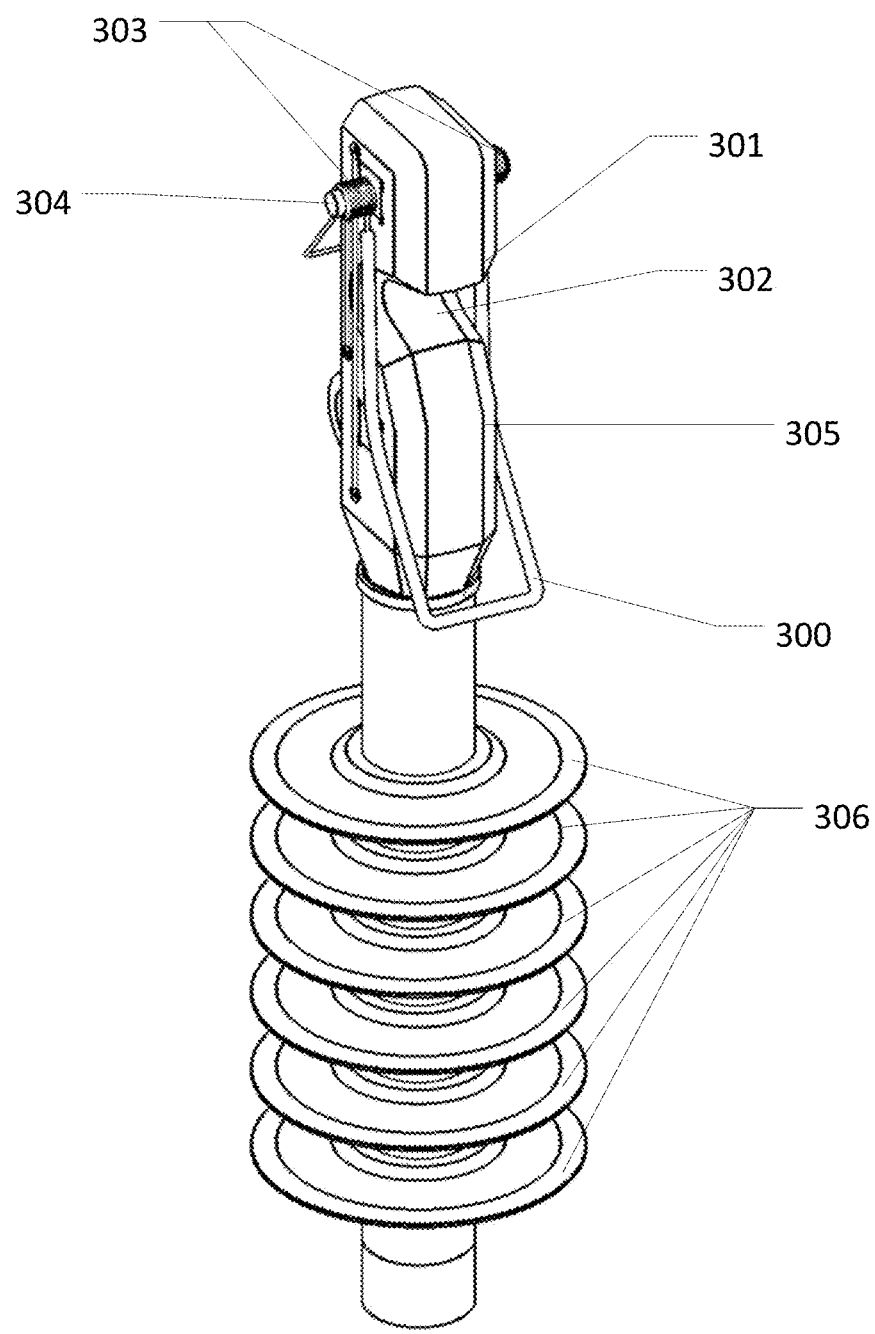
FIG. 3A illustrates a sensory assembly.

FIG. 3A illustrates a sensory assembly 101. Sensory assembly 101 can comprise a fastener 300. Fastener 300 can also comprise a spring 303 and/or a dowel 304. Sensory assembly 101 can also comprise an outer frame 301, which fastener 300 can be attached to. Structure of outer frame 301 can comprise a concave insert 302. Outer frame 301 can comprise a ramp 305 on a side adjacent to concave insert 302. Furthermore, sensory assembly 101 can comprise a plurality of fins 306 along the body or shaft of outer frame 301. Fins 306 can increase the high-voltage creep distance.

Sensory assembly 101 can be capable of physical attachment onto power lines 200 or conductor of power lines 200 by fastener 300. In one embodiment, fastener 300 can comprise a single piece of wire, for example, which can be metallic, in one embodiment. In one embodiment, fastener 300 can also be attached externally to outer frame 301 at spring 303. Spring 303 can be on opposing sides of outer frame 301. Spring 303 can be wrapped around dowel 304. Dowel 304 can be a protruding shaft molded into outer frame 301, in one embodiment. In one embodiment, fastener 300 can produce tension by loading of spring 303 around dowel 304.

In one embodiment, outer frame 301 can comprise a shape accommodating the attachment of sensory assembly 101 onto power line 200. In one embodiment, shape of outer frame 301 can comprise a concave insert 302. Concave insert 302 can be a space or ridge in outer frame 301 shaped to fit around power line 200. Shape of concave insert 302 can allow outer frame 301 to grasp power line 200 and act as a pocket capable of surrounding most of the surface of power line 200.

In one embodiment, spring 303 can form a biased hinge. Spring 303 can allow fastener 300 to be capable of pushing power line 200 into concave insert 302. In one embodiment, fastener 300 can comprise a bent, outward curve shape that can allow fastener 300 to catch power line 200. As a result, sensory assembly 101 can hang from power line 200.

Figure 3B:
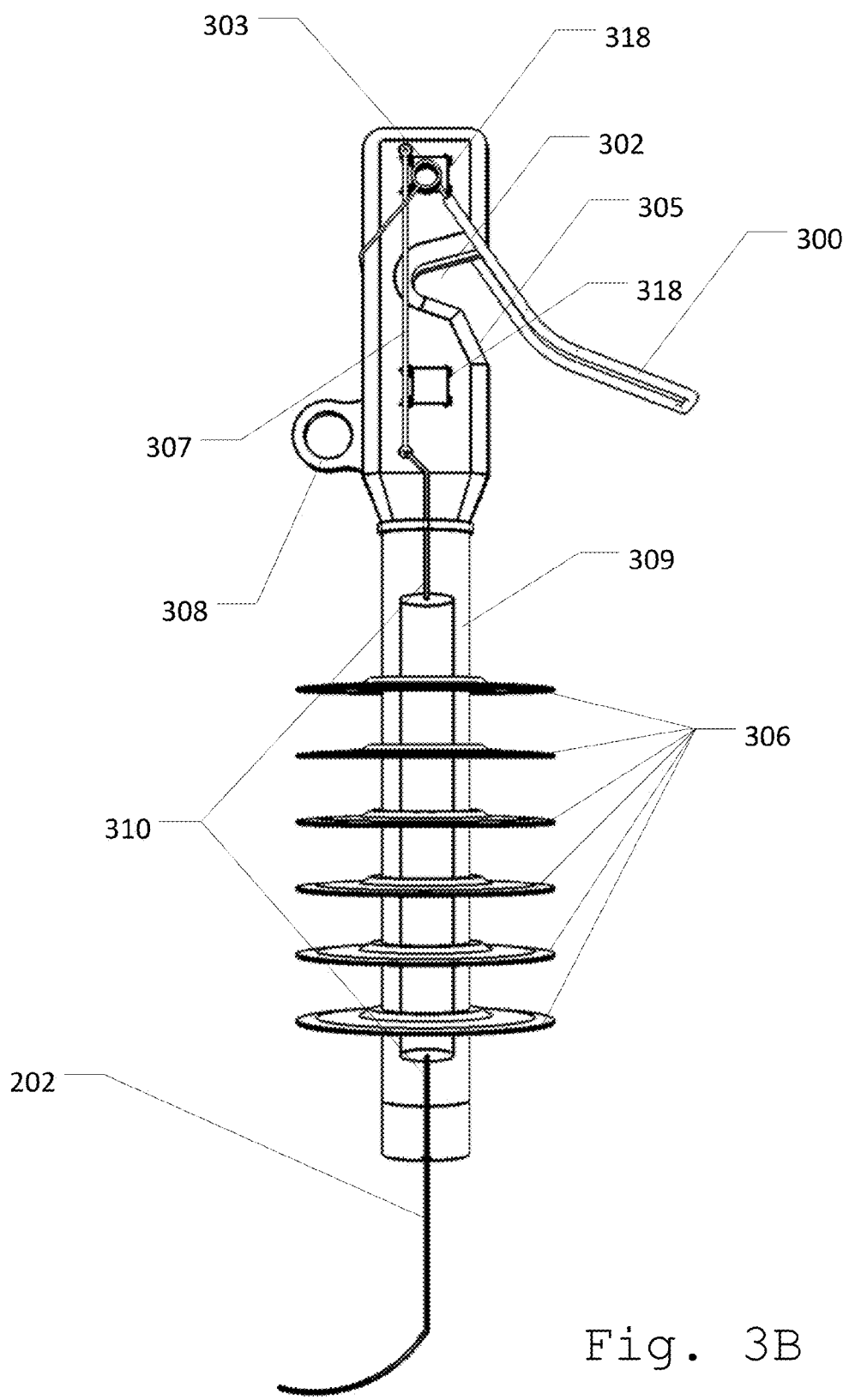
FIG. 3B illustrates an internal mechanical view of a sensory assembly.

FIG. 3B illustrates an internal mechanical view of sensory assembly 101. Sensory assembly can comprise a printed circuit board 307. Printed circuit boards 307 can comprise a plurality of air core pickup coils 318. Once attached to power line 200, sensory assembly 101 can be capable of measuring current from power line 200 via air core pickup coils 318. Printed circuit board 307 can be attached to a high voltage resistor 309 as shown in FIG. 3B for powering the circuit board 307.

Air core pickup coils 318 can be used to pick up current from power line 200. In one embodiment, air core pickup coils 318 can be Rogowski coils. In one embodiment, concave insert 302 can be an aluminum part. As power line 200 is captured by concave insert 302 it is held in the center of air core pickup coils 318, by fastener 300. Air core pickup coils 318 can be in phase with respect to a magnetic field centered between them. Air core pickup coils 318 can be out of phase to a field from a distance, specifically in relation to other power lines 200, which they are not touching. Air core pickup coils 318 can provide a signal to printed circuit board 307 used for measuring current.

High voltage resistor 309 can cause a small current, typically in the milliamp range, to flow through circuitry on printed circuit board 307, to concave insert 302 in contact with power line 200. Voltage resistor 309 can comprise a plurality of ends 310. Ends 310 can comprise wiring capable of generating current for measuring voltage and power the circuit board 307. Voltage resistor 309 can be highly resistive and capable of standing off the maximum expected surge voltage from power lines 200. In one embodiment, voltage resistor 309 can be a variety of inches in length and made to be made longer for higher voltage power lines 200, as an increasing in length of voltage resistor 309 can result in a higher-ohm voltage resistor 309. In one embodiment, voltage resistor 309 can be 10 inches long and ½ inch diameter for an embodiment where power line 200 is 15 kilovolts (kV). In another embodiment, voltage resistor 309 can be longer for higher voltage embodiments of power line 200.

Voltage resistor 309 can be connected to printed circuit board 307 at one end 310 and further connected to ground wire 202 at an opposing end 310. As a result, voltage can be measured from the junction point of voltage resistor 309 and power line 200. Fins 306 can increase the electrical creep distance from power line 200 to voltage resistor 309 and ultimately to ground wire 202. As a result, the surface distance along the current's path can be increased, protecting insulation of sensory assembly 101.

A hot stick ring 308 can be attached on a side opposite of fastener 300 and/or concave insert 302. Hot stick ring 308 can allow sensory assembly 101 to be attached to a hot stick, which is commonly used for installation by people having ordinary skill in the art. By way of hot stick ring 308, an installer can elevate sensory assembly 101 so that power line 200 is between a ramp 305 and outer frame 302. Ramp 305 can be an angled slope shaped along outer frame 302. As sensory assembly 101 can be pulled down, spring-loaded fastener 300 can extend until power line 200 gets to ramp 305 that leads into concave insert 302. The downward force on sensory assembly 101 can cause power line 200 to travel along angle of ramp 305 and seat in concave insert 302.

Figure 3C:
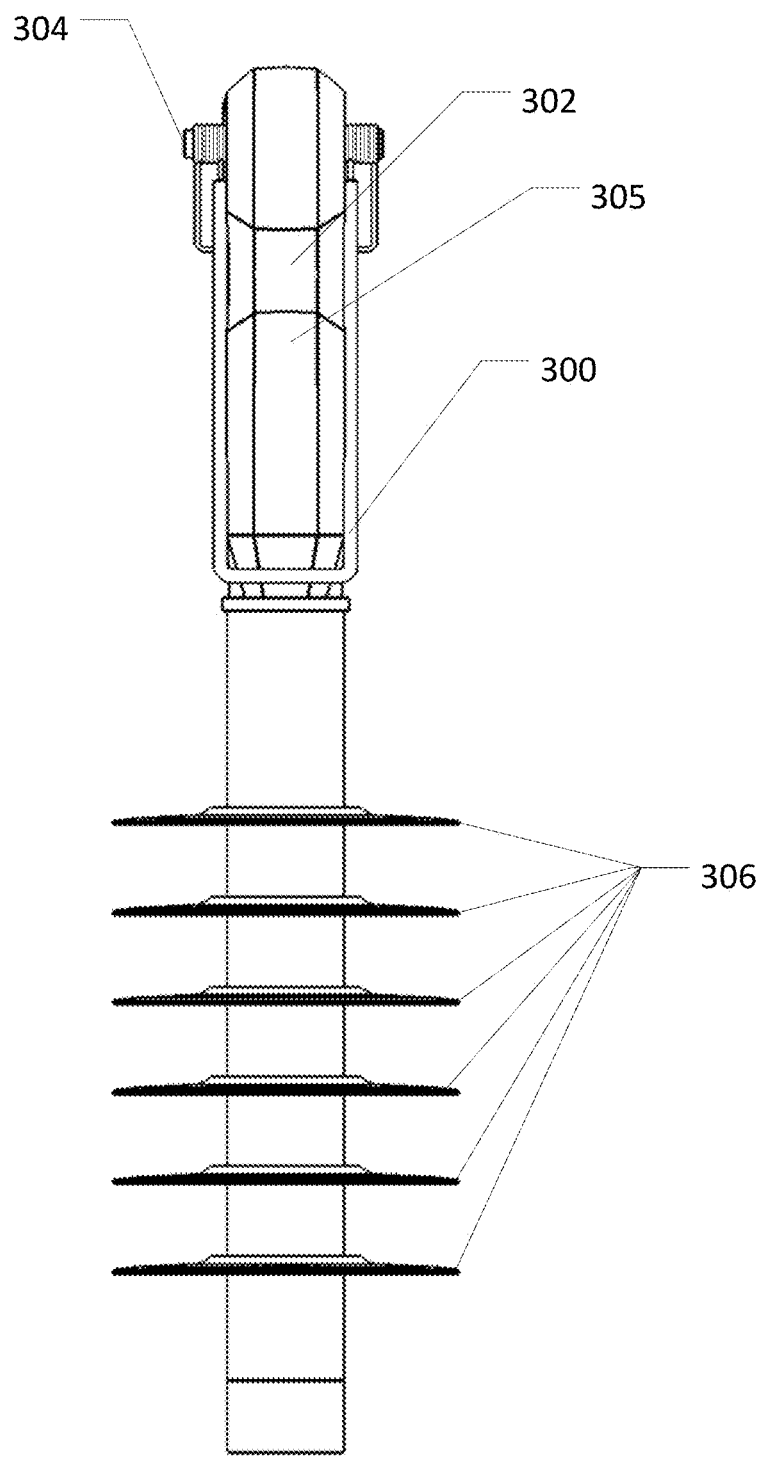
FIG. 3C illustrates a front view of a sensory assembly

FIG. 3C illustrates a front view of sensory assembly 101. In one embodiment, fastener 300 can be attached as a loop at two ends of sensory assembly 101. Fastener 300 can be a length that extends over and/or beyond concave insert 302. As a result, the frame of fastener 300 can be parallel to the edges of concave insert 302. In conjunction with fastener 300, in one embodiment, concave insert 302 can be positioned directly behind or beneath fastener 300. In one embodiment, fastener 300 can be pulled away from outer frame 301 in an open position and then clasped shut over power line 200 at concave insert 302 in a closed position. As a result of tension, fastener 300 can be capable of grasping power line 200 and housing it within concave insert 302.

Figure 3D:
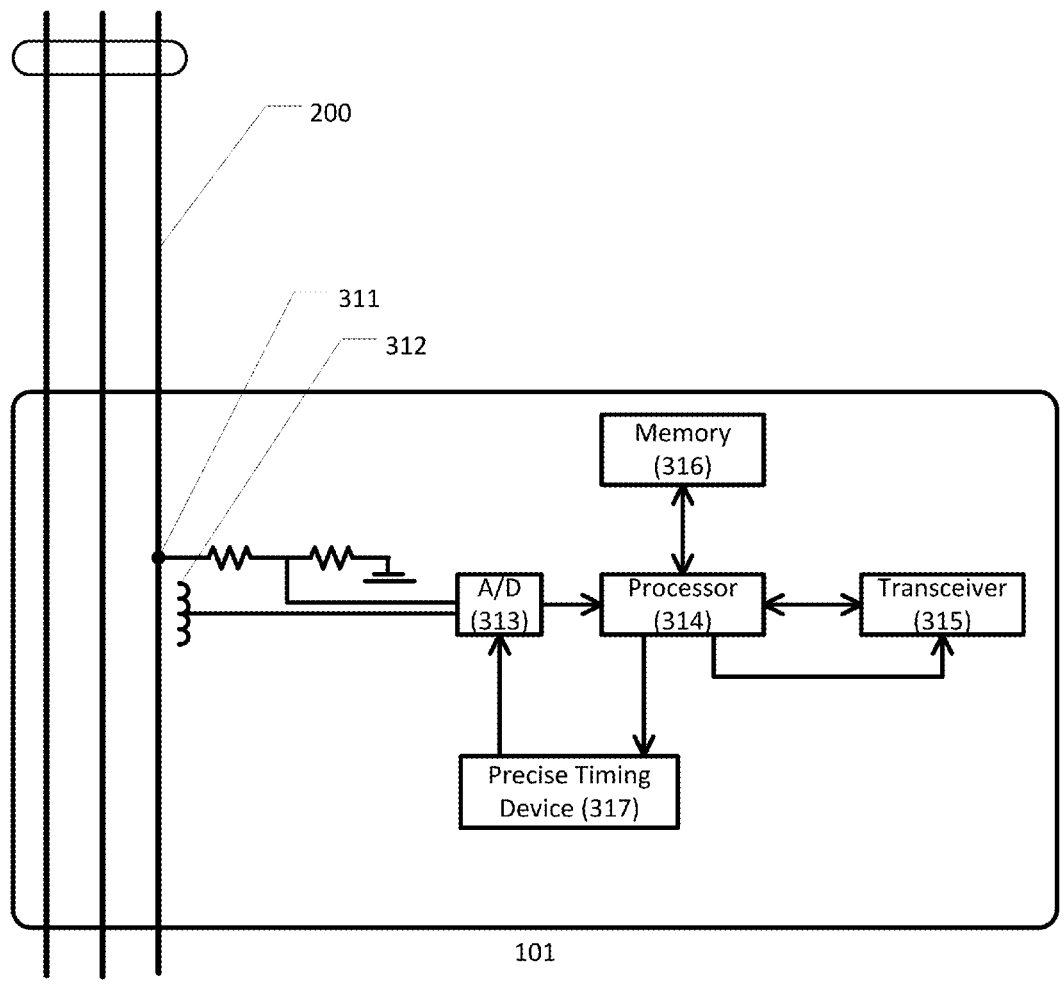
FIG. 3D illustrates an internal view of sensory assembly.

FIG. 3D illustrates an internal view of sensory assembly 101. Sensory assembly 101 can comprise a voltage meter 311, current meter 312, an analog to digital converter (A/D converter) 313, a sensory microprocessor 314, a sensory transceiver 315, a sensory memory 316 and a precise timing device 317. In one embodiment, voltage meter 311 can be a voltage divider circuit. Such voltage divider circuit can comprise small resistor on printed circuit board 307 and high voltage resistor 309, in one embodiment. In one embodiment, current meter 312 can be one or more coils upon which power line 200 current can induce a coil current. Analog to digital converter 313 can convert data from an analog format to a digital format. Sensory microprocessor 314 can make logical calculations, process and transmit digital data, send electrical signals to other parts of sensory assembly 101, and/or perform a variety of other computational functions. Sensory transceiver 315 can wirelessly transmit and receive electronic data. Sensory memory 316 can store data and/or electronic signals away to be used or transmitted later at a specified time. Precise timing device 317 can be used as the mechanism to time the sending of a signal, such as for the synchronization of sensory assembly 101, which will be discussed more thoroughly below.

Once voltage meter 311 and current meter 312 read line voltage and line current power line 200, and transmit voltage reading and current reading to A/D converter 313. In one embodiment, voltage meter 311 can be a voltage divider circuit. In one embodiment, current meter 312 can be a Hall Effect Sensor or a coil. A/D converter 313 can translate raw, analog data sampled into digital voltage data and/or digital current data. A/D convertor 313, in one embodiment, can sample voltage reading and current reading at least 16 samples per power line cycle. In another embodiment, analog to digital converter 313 can be capable of sampling voltage and current at a greater rate. Using timing information from precise timing device 317, A/D converter 313 can include timing data within or along with digital voltage and/or digital current data to microprocessor, hereinafter referred to "digital data."

Sensory microprocessor 314 can receive digital data. In one embodiment, sensory microprocessor 314 can filter the digital data received from A/D converter 313 using digital signal processing algorithms. Once filtered, raw data samples can be scaled to fit a digital format compatible with sensory transceiver 315. As necessary, sensory microprocessor 314 can store digital data and computations in memory 316.

Sensory microprocessor 314 can send digital data to transceiver 315. Transceiver 315 can then send digital data to common assembly 100. Transceiver 315 can further receive precision timing data from common assembly 100. Transceiver 315 can transmit the precision timing data to sensory microprocessor 314, which can then send precision timing data to précising timing device 317. In one embodiment, precise timing device 317 can be a separate device that receives a timing signal from sensory microprocessor 314 and sends a timing signal to A/D convertor 313. In one embodiment, precise timing device 317 can be built into sensory microprocessor 314. Precise timing device 317 can provide timing information to analog to digital converter 313. Precise timing information is necessary to do calculations using digital data from multiple sensory assemblies 101, as will be discussed further below. Sensory microprocessor 314 can set sensory transceiver 315 to transmit or receive mode, as it can act as a control line for sensory transceiver 315.

Figure 4:
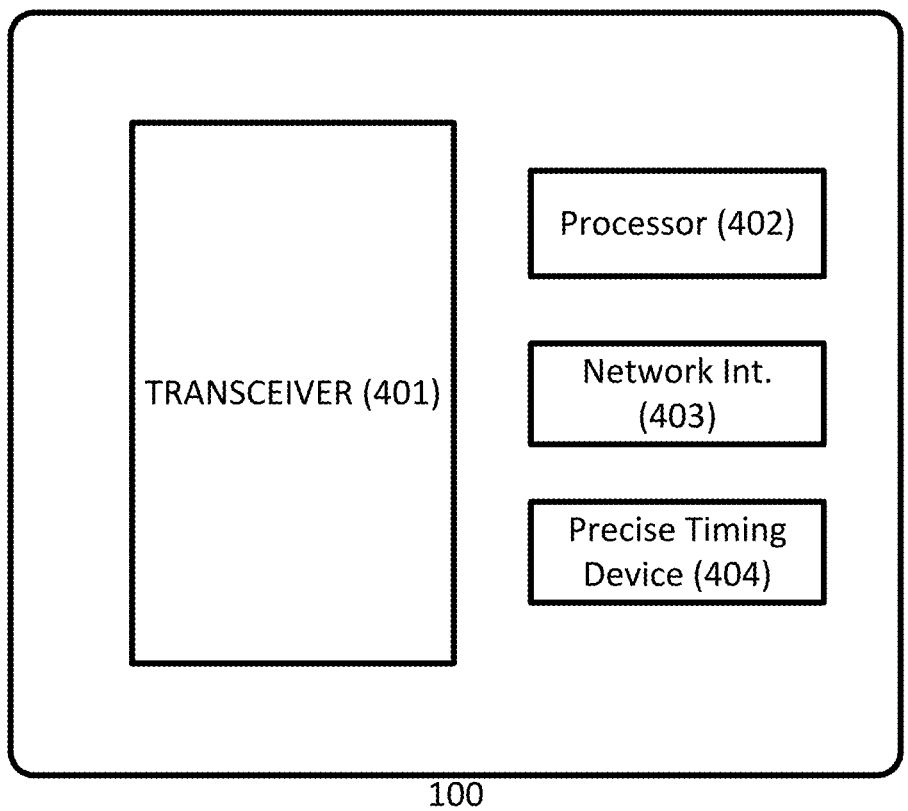
FIG. 4 illustrates an internal view of a common assembly.

FIG. 4 illustrates an internal view of common assembly 100. Common assembly 100 can comprise a common transceiver 401, a common processor 402, a networking interface 403, and a second precision timing device 404. Common transceiver 401 can wirelessly transmit and can receive electronic data between common assembly 100 and each sensory assembly 101. Furthermore, in one embodiment, common transceiver 401 can interface common assembly 100 with network 102, to communicate with monitoring computer 103. Common assembly 100 can receive digital data and can perform logical calculations on digital data from each sensory assembly. Specifically, common transceiver 401 can send digital data it receives from sensory transceiver 315, to common processor 402, in a format that common processor can understand. Common processor 402 can receive data from common transceiver 401. Common processor can then make logical calculations, can process and can transmit digital data, can send electrical signals to other parts of common assembly 100, and can perform a variety of other computational functions. A second precise timing device 404 can receive signals from microprocessor 402. Second precise timing device 404 can create a signal to send through common transceiver 401 to each sensory assembly 101 to synchronize each sensory assembly 101. Furthermore, network interface 403 can adapt common assembly 100 to another network 102 and/or monitoring computer 103.

Second timing device 404 can send data, which can cause sensory assembly 101 to coordinate timing of when voltage data and current data is measured from power line 200. Precise timing device 404 can receive data from processor 402 and resend signals through transceiver 401 to sensory assembly 101, in one embodiment. In another embodiment, precise timing device 404 can resend signals back through processor 402, which can then send data through common transceiver 401 and, ultimately back to sensory transceiver 315. With timing data from common precise timing device 404, each sensory assembly 101 can be synchronized to each other to sample digital data simultaneously, for example. This synchronization can facilitate the comparison and analysis of wave forms for the voltage and current on each power line, by common assembly 100. As a result, synchronization can allow for both current and voltage waves to be monitored precisely by common assembly 100. As discussed further below, synchronization can alert power line monitoring system 104 to any misalignments shown in the wave data information received.

Aside from data transfer, common microprocessor 402 can calculate digital information after receiving synchronized signals back from sensory assembly 101. Specifically, microprocessor 402 can calculate the root-means-square value (RMS) of the voltage and current, as well as ground current, in one embodiment. In one embodiment, common processor 402 can communicate calculations and waveform data received and processed to monitoring computer 103. Calculations can include, but are not limited to Fourier analysis, voltage and current total harmonic distortion (THD), phase angle between the current and voltage, power factor, wattage and VARS.

Furthermore, network interface 403 can allow common assembly 100 to transfer data and calculations from microprocessor 402 to network 102 and/or monitoring computer 103 associated with monitoring power lines 200. In one embodiment, the wave forms for the voltage and current of each phase and ground can be reconstructed at the common assembly 100. Furthermore, common assembly 100 and/or network 102 can transfer waveform data to monitoring computer 103 using a transient data exchange format, as described in IEEE Std. C37.111. The Institute for Electrical and Electronics Engineers, Inc. describes a standard data exchange format used for power systems and specifically defines an interchange of various types of fault, test, or simulation data for electrical power systems. Furthermore, the Institute describes sampling rates, filters, as well as sample rate conversions for data transfer.

In other embodiments, common assembly 100 may have other functions, such as repairing problems in power line 200. In one embodiment, common assembly 100 can operate a motor operated switch to shift power through the conductors of power lines 200 or switch power to a capacitor bank for power factor control of the power lines 200. In one embodiment, common assembly 100 can comprise a remote terminal unit.

In one embodiment, sensory transceiver 315 and/or common transceiver 401 can comprise a frequency hopping spread spectrum (FHSS) radio can be used for communications between sensory assembly 101 and common assembly 100. Since the FHSS radios of each sensor assembly 101 can be synchronized as well as analog to digital converters 313 of each sensor assembly 101, the frequency hopping interval of 60 Hz can be used to synchronize analog to digital converters 313 to an exact multiple of the hopping frequency, in one embodiment. In one embodiment, the following rates can be appropriate for this scheme: frequency hopping rate of 60 Hz; raw analog to digital sampling rate of 64 samples/cycle or 3,840 samples/second; filtered sample rate of 16 samples/cycle or 960 samples/second; rate data is sent from each sensory assembly of 60 Hz; number of cycles of date sent each cycle of 1; size of each filtered sample of 16 bits. In one embodiment, the minimum data from each sensory assembly 101 in each cycle can include 512 bits (16 bits times 16 samples times 2 channels).

The voltage and current data sampled by sensory assembly 101 can be processed by common assembly 100 on a sinusoidal wave in phases, which can represent the cycle of the current and voltage movement along power line 200 over time, as discussed further below.

Figure 5:
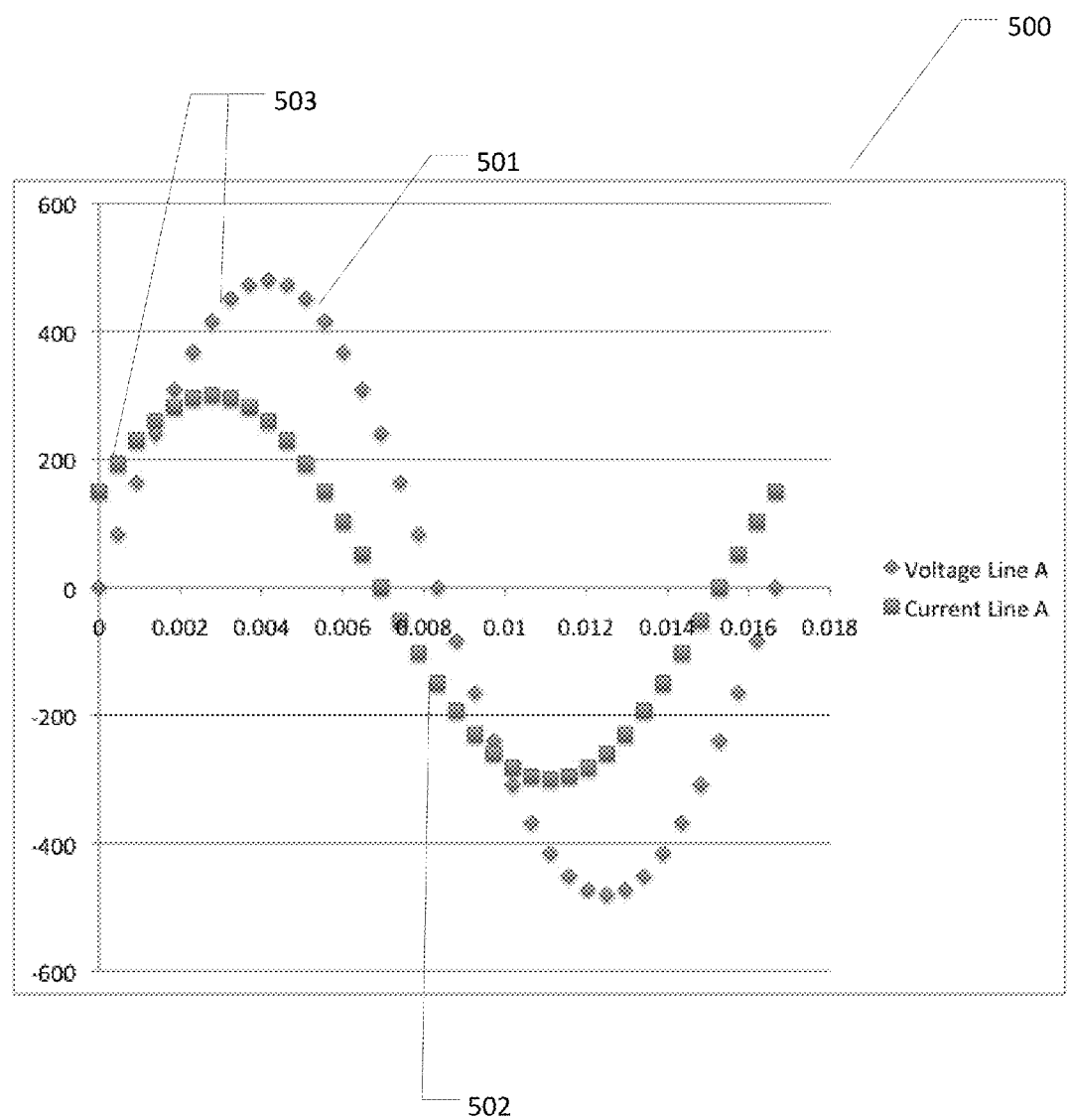
FIG. 5 illustrates a voltage and current sample for a single phase.

FIG. 5 illustrates a voltage and current sample for a single phase on power line 200. Graph 500 is an exemplary, not limiting, representation of wave form data of voltage and current for a single phase of power line 200. In one embodiment, common assembly 100 can send data to produce graph 500 of the electrical activity of power lines 200. Graph 500 illustrates the voltage samples 501, and the current samples 502 of a single phase of a power line 200. RMS values of the voltage and current can be calculated, as well as the relative phase angle between voltage and current on the power line 200, and the power factor for that phase. Furthermore, data can be represented as vectors, instead of points on a graph relating to time. Either manifestation of data can be used in facilitating calculations at any point in the signal chain.

Specifically, graph 500 can illustrate a representation of how sensory assembly 101 measures the phase currents at 16 bits times 16 samples in one embodiment. From one single conductor, first wave 501 represents voltage over time, while second wave 502 shows the levels of current over time. Points 503 on first wave 501 and second wave 502 can represent the precise moments sensory assembly 101 took a reading to then yield the wave patterns. As a result, voltage can be compared with current. After analyzing both, adjustments to power lines 200 can be made as needed.

Once data samples are processed and transmitted, the actual waveforms of the currents and voltages can be recreated on power line 200. This data may be used by algorithms in common assembly 100 to calculate voltage and current root-mean-square (RMS), voltage and current total harmonic distortion (THD), phase angle between the current and voltage, power factor, watts and VARS. The sample data from each of the three phase currents can be summed, yielding calculated samples of the neutral or ground current. The resulting data can be sent to monitoring computer 103.

Measurements from sensory assembly 101, microprocessor 402 can calculate, for example, phase differences between lines, and also phase shifts between voltage and current. These calculations can aid in the detection of power inefficiencies. Not only can power line monitoring system 104 calculate values on each individual power line 200, but power line monitoring system 104 can take calculations of the values of all power lines 200 averaged together.

In one embodiment, one calculation on data samples can include Fourier analysis. Specifically, the Fourier analysis can represent any waveform by a set of sine waves. Any pure sine wave can be described by its magnitude and phase, including its size and how it relates to time. Waveform can be represented in two different ways. One way can include showing a collection of points on a graph relating to time, while another way can include showing a collection of vectors. In one embodiment, samples can be used to calculate magnitudes and vectors to facilitate calculations at any point in power line monitoring system 104. While Fourier analysis, in one embodiment, can take place in sensory assembly 101, in another embodiment, Fourier analysis can similarly take place in common assembly 100. In yet another embodiment, Fourier analysis can take place in both common assembly 100 and sensory assembly 101.

Graph 500 is an exemplary, not limiting, representation of voltage data and current data from the same phase of power line 200. On graph 500, the values on the x-axis represent the phase, while the values on the y-axis represent volts for the voltage wave and amps for the current wave. As graph 500 in indicates, two different waves 501 and second wave 502 go through the horizontal axis at different times, signaling a phase shift between voltage and current. From analyzing the data of power line 200, power line monitoring system 104 can calculate power factor to determine whether the power line 200 is leading or lagging. Since both sensory assembly 101 for voltage and current can be synchronized, first wave 501 and second wave 502 on graph 500 can indicate to an operator that a potential phase shift is occurring on power line 200 and producing imaginary power. As a result, an operator, common assembly, or power line monitoring system 104 can apply necessary remedies to power distribution, such as adding or removing a capacitor bank in one embodiment.

Figure 6:
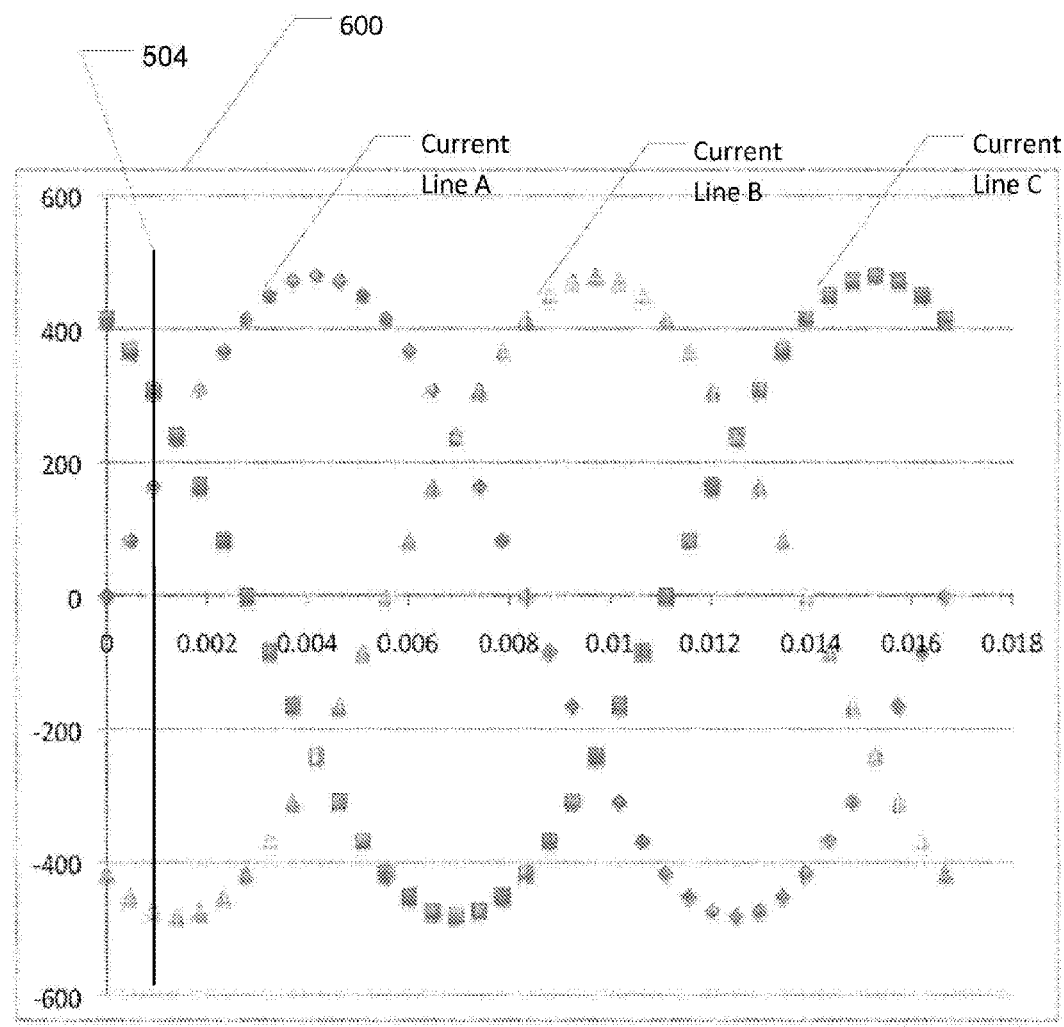
FIG. 6 illustrates current samples for three phases.

FIG. 6 illustrates current samples for three phases. Specifically, graph 600 shows three sine waves representing the comparison of current samples of the three phases of power line 200. Graph 600 is an exemplary, not limiting, representation of how current values can be compared over time between different phases of power line 200. Sensory assembly 101 can measure each phase of power line 200. In one embodiment where power line 200 is a 60 Hz system, sensory assembly 101 can sample each line 64 times per cycle, for example. Sensory assembly 101 can then send the values of these points further down power line monitoring system 104 to produce graph 600. Graph 600 can show 36 samples per cycle, in one embodiment. Since current lines B and C have equal amplitude with 120 degrees separation, loads of power line 200 are balanced, and there is no ground current.

Synchronization of sampling at power line 200 can allow the comparison of waveforms for the voltage and current on each of power line 200 conductors to be compared. As a result, common assembly 100 can achieve calculations crucial to monitoring power lines 200. For example, in one embodiment, synchronized data of three conductors of a three phase power lines 200 can help determine ground or neutral current that can be computed as the net real time sum of the three phases of current. As a result of aligning the timing of three signals on power line 200 indicated as line 504, as shown in FIG. 6, ground current can be calculated and the parameters for a balanced load among the voltage and current can be gauged.

Synchronization of measurements at sensory assembly 101 can allow monitoring system 104 to measure current and voltage levels in the same time frame. As multiple measurements taken by sensory assembly 101 can be synchronized, the sampling times of each analog to digital conversions can occur simultaneously. Without synchronized data, microprocessor 402 of common assembly 100 would be unable to calculate one current's phase relative to either another current or voltage. Specifically in an embodiment comprising a three-phase power line, if three signals are not aligned appropriately in time, then common assembly 100 cannot accurately calculate ground current.

Various changes in the details of the illustrated operational methods are possible without departing from the scope of the following claims. Some embodiments may combine the activities described herein as being separate steps. Similarly, one or more of the described steps may be omitted, depending upon the specific operational environment the method is being implemented in. It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. An improved sensory assembly system for monitoring power lines of a three phase electrical power system comprising:
   a plurality of sensory assemblies, each of said sensory assemblies adapted to hang from and in conductive electrical contact with a respective power line of the three phase electrical power system so as to be powered by the respective power line;
   each of said sensory assemblies comprising:
   an outer frame including an insert for receiving said respective power line, said insert in conductive electrical contact with said respective power line;
   a current sensor magnetically coupled to said respective power line for measuring current;
   a voltage sensor including a voltage resistive divider having an input node and an output node, said input node in conductive electrical contact with said respective power line via said insert, said output node connected to ground through a high voltage resistor for measuring voltage;
   an analog to digital converter that
   receives a first signal from said output node of said voltage sensor, said first signal proportional to a voltage on said respective power line;
   receives a second signal from said current sensor, said second signal proportional to a current on said respective power line;
   samples said first signal to produce a digital voltage signal, said digital voltage signal representing voltage on said respective power line;
   samples said second signal to produce a digital current signal, said digital current signal representing said current on said respective power line;
   a sensory transceiver electrically connected to said analog to digital converter that wirelessly receives timing information from a precision timing device, and transmits wirelessly said digital voltage signal and said digital current signal, said digital voltage signal and said digital current signal comprising timing data related to said timing information; and,
   a common assembly comprising:
   a common transceiver for receiving said timed digital voltage signal and said timed digital current signal from each of said plurality of sensory assemblies,
   means for sensing ground or neutral current and instantaneous current and voltage between the three phases of the electrical power system.

2. The system of claim 1, wherein said current sensor is a coil.

3. The system of claim 1, wherein said current sensor is a Hall effect sensor.

4. The system of claim 1, wherein said sensory transceiver is for communicating with said common transceiver, said common transceiver capable of transmitting raw and filtered data samples to the common assembly.

5. The system of claim 4, wherein said sensory transceiver is for sending data to and receiving data from said common transceiver.

6. The system of claim 1, wherein said voltage sensor samples said voltage and said current sensor samples said current, both at a rate of at least 16 samples per power line cycle.

7. The system of claim 5, wherein said sensory transceiver communicates with a digital signal processing algorithm scaled to fit a digital format compatible with said common transceiver and said sensory transceiver.

8. The system of claim 5, wherein each of said sensory transceivers and said common transceiver further comprises a frequency hopping spread spectrum (FHSS) radio for communications between said sensory assembly and said common assembly.

9. The system of claim 1, wherein the means for sensing ground current and instantaneous current and voltage between the three phases of the electrical power system comprises a microprocessor, said microprocessor analyzing said timed first signals synchronized for said plurality of phases by computing the net real time sum of the current of said plurality of phases to determine ground current and said microprocessor analyzing said timed digital voltage signal and said timed digital current signal synchronized for said three phases by computing instantaneous current and voltage between the plurality of phases.

10. The system of claim 1, wherein the voltage resistive divider of each of said sensory assemblies includes a line to ground connection for generating current for measuring voltage and powering a circuit board within the sensory assembly.

11. An improved sensory assembly system method for monitoring power lines of a three phase electrical power system, said improved sensory assembly system including three sensory assemblies one for each of the three phases of the electrical power system, each of said sensory assemblies adapted to hang individually from and in conductive electrical contact with a respective one of the power lines of said three phase electrical power system so as to be powered by the respective one power line, each of the sensory assemblies includes an analog to digital converter, a sensory transceiver electrically connected to the analog to digital converter, a sensory microprocessor connected in circuit with the analog to digital converter and the sensory transceiver, a voltage sensor in conductive electrical contact with said respective one power line, the voltage sensor including a voltage resistive divider having an input node and an output note, said input node in conductive electrical contact with said respective one power line, said output node connected to ground through a high voltage resistor, a current sensor for measuring current magnetically coupled to said respective one power line, a common assembly including a common transceiver operatively connected to a common precision timing device and a common microprocessor, said method comprising:

attaching each of said sensory assemblies capable of measuring voltage and current respectively to one of said power lines by hanging from said respective one power line via an outer frame including an insert for receiving said respective one power line, connecting said insert in conductive electrical contact with said respective one power line, formatting analog wave data sampled from the respective voltage sensor and current sensor of said respective one power line into digital parameters via the analog to digital converter, the analog to digital converter receiving a first signal from said output node of said voltage sensor on said power line, said first signal proportional to a voltage on said attached power line, receiving a second signal from said current sensor, said second signal proportional to a current on said attached power line;

sampling said first signal to produce a digital voltage signal, said digital voltage signal representing a voltage on said attached power line;

sampling said second signal to produce a digital current signal, said digital current signal representing current on said attached power line;

the sensory transceiver wirelessly receiving via the common transceiver a precision timing signal representative of timing information from the common precision timing device, and transmits wirelessly said digital voltage signal and timed digital current signal, said digital voltage signal and said digital current signal comprising timing data related to said timing information;

broadcasting said timed digital voltage signal and said timed digital current signal from each of said sensory transceivers of each of said sensory assemblies to the common transceiver on the common assembly;

monitoring said timed digital voltage and current signals synchronized in the same phase on the power lines by the respective sensory assembly and the common assembly; and, determining the net real time sum of the current of said three phases to determine ground or neutral current by a microprocessor on the common assembly analyzing said timed digital voltage and current signals synchronized for the three phases by the microprocessor computing instantaneous current and voltage between the three phases.

12. The method of claim 11, wherein each of said sensory transceivers is for sending data to and receiving data from said common assembly.

13. The method of claim 11, wherein said sensory transceiver is for sending data to and receiving data from said common transceiver, said common transceiver sending filtered data samples to said common assembly.

14. The method of claim 11, wherein said sensory assemblies sample voltage and current at a rate of at least 16 samples per power line cycle.

15. The method of claim 11, wherein said sensory transceiver is for sending and receiving a digital signal processing algorithm scaled to fit a digital format compatible with said common transceiver and said sensory transceiver.

16. The method of claim 11, wherein each of said sensory transceivers and said common transceiver comprises a frequency hopping spread spectrum (FHSS) radio, wherein said frequency hopping spread spectrum radio is a radio for communications between said sensory assembly and said common assembly.

17. The method of claim 11, wherein said data transferred from said sensory assembly for producing graphical representations of voltage and current levels.

18. The method of claim 11, wherein each of said sensory assemblies performs calculations via the respective sensory microprocessor comprising Fourier analysis.

19. The method of claim 11, wherein said common assembly performs calculations via the common microprocessor comprising Fourier analysis.

20. The method of claim 11, wherein the voltage resistive divider of each of said sensory assemblies includes a line to ground connection for generating current for measuring voltage and powering a circuit board within the sensory assembly.

\* \* \* \* \*